Sept. 10, 1974 K. D. BEYER ET AL 3,834,939
METHOD OF FORMING DOPED SILICON OXIDE LAYERS ON SUBSTRATES AND PAINT-ON COMPOSITIONS USEFUL IN SUCH METHODS
Filed Aug. 4, 1972
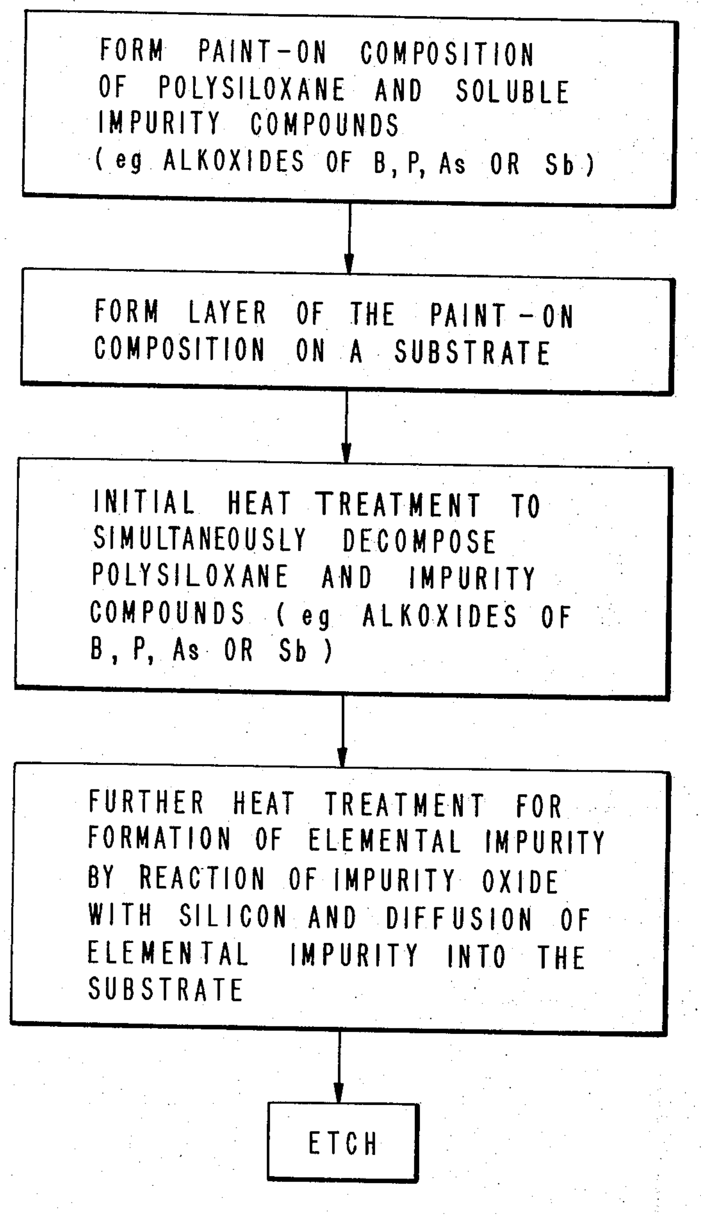

United States Patent Office
3,834,939
Patented Sept. 10, 1974

3,834,939

METHOD OF FORMING DOPED SILICON OXIDE LAYERS ON SUBSTRATES AND PAINT-ON COMPOSITIONS USEFUL IN SUCH METHODS

Klaus D. Beyer, Poughkeepsie, and Reginald F. Lever, Putnam Valley, N.Y., assignors to International Business Machines Corporation, Armonk, N.Y.

Continuation-in-part of abandoned application Ser. No. 12,573, Feb. 19, 1970. This application Aug. 4, 1972, Ser. No. 277,958
Int. Cl. B44d *1/18*
U.S. Cl. 117—201 1 Claim

ABSTRACT OF THE DISCLOSURE

Methods of forming impurity doped silicon oxide layers on semiconductor substrates by first forming a paint-on composition comprising a siloxane and a soluble impurity compound, such as alkoxides containing the suitable impurities such as B, P, As and Sb. A substrate coated with the paint-on composition is heat-treated in an oxidative atmosphere in order to change the coating to a layer containing silicon dioxide doped with an oxide of one or more of the impurity elements. A reactive siloxane polymer of a particular structure may be added to the paint-on composition to improve its pertinent characteristics. The impurity oxide contained in the silicon dioxide serves as a concentrated dopant source for diffusion. Thus, in the interface layer between silicon and the mixture of the impurity oxide and silicon oxide the silicon reacts with the respective oxide to form elemental impurities and $SiO_2$.

Under siloxanes we understand a class of compounds distinguished by covalent linkage of silicon-oxygen-silicon with the other electrovalence requirements satisfied by organic and/or inorganic substituents. The term polysiloxanes refers to multiple units of the basic siloxane unit which combine to form a backbone structure of molecules having various molecular weights.

CROSS REFERENCE TO RELATED APPLICATION

This application is a continuation-in-part of application Ser. No. 12,573 filed Feb. 19, 1970, now abandoned.

BACKGROUND, SUMMARY AND OBJECTS OF THE INVENTION

The invention is in the field of forming impurity doped silicon oxide layers on silicon or germanium wafers, or on other suitable substrates. Such layers are useful in the fabrication of semiconductor devices and are particularly useful in the fabrication of microelectronic or "integrated" circuits.

In the prior art, the fabrication of a semiconductor microelectronic circuit is begun with an appropriately doped silicon wafer with surfaces which are lapped flat, polished, and chemically etched to remove surface damage.

In the next step, typically a thin surface layer of the silicon is converted to silicon dioxide intended to serve as a barrier to the diffusion of dopants into the silicon. This dioxide film can be formed in many ways, but it is usually done by exposing the silicon surface to oxygen and/ or water vapor at about 1100° C. for one to two hours. The details of the procedure determine the quality and thickness of the oxide film.

The next conventional step is to apply photosensitive resist to the oxide. A photosensitive resist is a lacquer-like material which, upon exposure to light and to suitable development, is converted to a film which adheres to the substrate and resists chemical action. Where it is not exposed to the light, it washes away in the developer. Such a resist is called a negative resist; a positive resist is one which washes away where it is exposed light, and is fixed where not exposed.

For each step in the diffusion process, an appropriate photographic mask is required. The mask is an apertured plate through which the resist is exposed and developed. As a result, the resist is selectively removed and the oxide film exposed in those areas of the silicon wafer where the dopant diffusion is to take place. The wafer is then immersed in a chemical etchant which removes the oxide and exposes the silicon, after which the resist is completely removed.

The wafer is then placed in a high temperature furnace, usually about 1000 to 1300° C., and exposed to a gas containing the dopant atoms to be diffused into the silicon. The depth of the diffusion and the concentration of dopant atoms as a function of depth, is controlled by the details of the high temperature process. In this way, a controlled doping of a desired area on the silicon wafer is obtained. The entire process can be repeated as often as necessary by stripping the old oxide mask, forming a new masking film of oxide, etching holes in the oxide as required for the next diffusion, etc. The entire circuit of components and isolation barriers can be diffused into the wafer in this manner.

Thus, a multiple-step process is required in forming a doped silicon oxide layer. The process includes at least the steps of first forming a silicon dioxide layer over areas of the substrate which are to be protected from diffusion, and then diffusing dopants into the unprotected areas.

A principal object is to provide a more efficient and convenient process, whereby uniformity from wafer to wafer is achieved in production runs, by providing paint-on compositions which will serve to yield the silicon oxide layer required and to contain the dopant source for the diffusion operation.

A further object is to provide a source of silicon oxide which in its form of application is easily handled and by reason of the choice of compounds, is readily converted on subsequent treatment to a hard glass layer.

Another object of the present invention is to reduce the time factor which is involved in prior art processes, while substantially reducing production cost to a minimum in respect of the manpower and equipment required.

In a particular example, a substrate such as a wafer of silicon or germanium is coated with a layer of a paint-on composition comprising a polysiloxane (which forms silicon dioxide under heat treatment) and an alkoxide of one or more impurity elements such as boron, phosphorus, arsenic and antimony (under heat treatment, the alkoxide releases an oxide of the respective impurity element, that oxide then serving as a source of the particular impurity selected).

After the initial heat treatment, the resulting coating on the substrate is a layer of silicon dioxide containing an oxide of either an N-type impurity or a P-type impurity as selected. Upon further heat treatment, i.e. in a diffusion step, the impurity element is diffused into the surface of the substrate. The type and degree of doping depends on factors such as which alkoxide was in the paint-on composition, what proportions of different alkoxides were used, etc.

A reactive siloxane polymer of a particular structure may be added to the paint-on composition to improve its pertinent characteristics.

BRIEF DESCRIPTION OF THE DRAWINGS

The figure is a process flow diagram illustrating a method of forming impurity doped silicon oxide layers on suitable substrates.

DESCRIPTION OF PREFERRED EMBODIMENTS

Referring to the process flow diagram in the figure, one method of forming doped silicon dioxide layers on silicon or germanium substrates, or on other suitable substrates, includes as a first step the preparation of a paint-on composition comprising a polysiloxane and a soluble impurity compound of one or more doping elements such as boron, phosphorus, arsenic or antimony (B, P, As or Sb). Polysiloxane may be, for example, a polydialkyl siloxane, or polyalkylsiloxane resins. The impurity compounds may be selected from a wide group. One of these is the alkoxide group of the suitable impurity elements. The alkoxide of B, P, As or Sb may be a trialkoxide with one to nine carbon atoms in the alkyl group and may act as a solvent for the polysiloxane. Other impurity compounds that are useful are the boron compounds as follows: boroxines, boranes, borinic acids and boronic acids; also, the arsenic compounds: $As_2O_5$, cacodylic acid, alkyl and aryl-arsenic acid. Improved characteristics may be obtained by adding to the composition a reactive siloxane polymer such as polymethylalkyl siloxanes or polyhydroxyalkyl siloxanes of the structure:

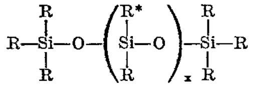

wherein R denotes an alkyl group having 1 to 6 carbon atoms and R* denotes either a hydrogen atom or an OH group, $x$ referring to at least two units.

As a second step, a layer of the paint-on composition is formed on a silicon or germanium substrate or on another suitable substrate by means such as a photoresist spinner.

As a third step, the layer of paint-on composition, or the substrate, or both, are heated in an oxidative atmosphere to decompose the polysiloxane and to cause sufficient cross-linking of the silicon polymer with oxygen bridges. In the siloxane decomposition step, the impurity compounds are oxidized to form impurity oxides or to react with the siloxane polymer to form impurity doped glasses. For polysiloxanes, the normal temperature range for this heating step is generally from about 200° C. to 1200° C. dependent upon the nature and composition of the oxidative atmosphere. However, other processes are available which will allow operation down to room temperature.

At this time, the substrate is coated with a continuous layer including silicon dioxide and entrapped impurities and thus serves as a diffusion source for diffusing the impurity into the substrate. Thus, as a result of further heating step, diffusion of such impurity into the substrate takes place to result in a substrate having particular electrical characteristics. The temperature range for this further heating step is above 900° C.

The next step is to utilize conventional etchings to remove the used doped oxide layer.

In this description, the phrase "forming layers of the paint-on composition" refers both to forming continuous layers, and to forming patterns similar to photoresist patterns.

The following specific examples are illustrative of specific embodiments of the invention only and are not intended to limit or otherwise circumscribe the broad concept disclosed and illustrated by the drawing.

Example I

A slurry mixture of 1 gram of dimethylpolysiloxane, 1 gram of methylhydrogen polysiloxane and 20 grams of trimethylborate was prepared and painted upon a typical N-type silicon semiconductor wafer of <100> crystallographic orientation. The painted wafer was spun at 3000 r.p.m. for 30 seconds upon a customary spin drying semiconductor mechanism. The wafer was heated in an appropriate furnace to and held at 675° C. for 30 minutes in a molecular oxygen atmosphere. The said wafer was transferred to a second furnace and maintained at 1050° C. for 60 minutes in an argon atmosphere diffusion capsule.

The above procedure produced a semiconductor wafer having a sheet resistivity of 290 ohms per square and a 0.067 mils diffused impurity junction depth.

Example II

A slurry mixture of 3 grams of polydiethylsiloxane, 9.6 grams ethylacetate and 0.6 grams of tricyclohexylborate was prepared and painted upon a silicon semiconductor wafer described in Example I and spin dried as in Example I. The wafer was then heated to a temperature of 230° C. for 30 minutes in an appropriate furnace having an atmosphere comprising about 99% molecular oxygen and 1% ozone whereupon argon gas replaced the oxygen and ozone atmosphere mixture through a proper bleed-in device and the temperature raised to 1050° C. for 30 minutes to carry out the diffusion of impurity into the substrate.

The above procedure produced a semiconductor wafer having a sheet resistivity of 290 ohms per square and allowed continuous processing in a single furnace.

Example III

A slurry mixture of 2.4 grams of trifunctional methylpolysiloxane, 2.5 grams of trihexylborate and 10 grams of n-butylacetate was prepared and painted on a silicon semi-conductor wafer of the type described in Example I and similarly spun dried, followed by placing said wafer in an appropriate tube which was evacuated and 1 mm. of molecular oxygen bled into said tube which was then subjected to an approximate charge of 250 watts which produced a nascent oxygen and molecular oxygen atmosphere. Nascent oxygen being between 0.5%–1% and the remainder 99% molecular oxygen. A diffusion step followed wherein the wafer was heated to 1050° in an argon atmosphere to produce a semiconductor wafer having a sheet resistivity of 59.5 ohms per square and a junction depth of 0.89 microns.

Although the foregoing examples are illustrative embodiments, Example II discloses a procedure which is adaptable continuous processing and avoids the necessity of stress relieving in methods having multi-steps and heat cycling which tends to impart crystallographic dislocations to silicon semiconductor wafers.

Similarly, it was observed that upon using a slurry of dimethylpolysiloxane and trimethylborate as a paint-on material followed by heating to 1167° C. for 30 minutes in a nitrogen atmosphere produced an extremely pitted wafer surface condition which rendered the wafer non-acceptable as a semiconductor substrate material.

The use of a molecular oxygen atmosphere requires a temperature between 650°–1150° C. to effectuate proper oxidation of the siloxane paint-on compound and where ozone is added to the oxygen atmosphere a temperature of from 140°–250° C. is required. Nascent oxygen provides a room temperature decomposition but requires a multi-step processing.

While there have been shown and described and pointed out the fundamental novel features of the invention as applied to the preferred embodiments, it will be understood that various omissions and substitutions and changes in form and details of the device illustrated and in its operation may be made by those skilled in the art without departing from the spirit of the invention. It is the intention, therefore, to be limited only as indicated by the scope of the following claim.

We claim:

1. A method of forming an impurity doped silicon oxide layer on a semiconductor substrate comprising the steps of forming a paint-on material consisting essentially of (a) polysiloxane having the structure of

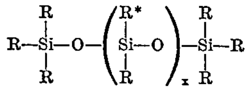

where R* is selected from the group consisting of a hydrogen atom, OH radical and an alkyl group, and R is an alkyl group of from one to six carbon atoms and $x$ refers to at least two units and (b) one or more soluble impurity compounds selected from the group consisting of $B(OR)_3$, $P(OR)_3$, $As(OR)_3$, and $Sb(OR)_3$, where R is an alkyl group consisting of from one to six carbon atoms; applying a layer of paint-on material on a semiconductor substrate; heating the layer in an oxidative atmosphere comprised of a mixture of 99% molecular oxygen and 1% ozone at a temperature of between 140° C. and 250° C. and for a time period of at least 30 minutes to decompose said polysiloxane into silicon oxide and said soluble impurity compounds into corresponding impurity oxides.

References Cited

UNITED STATES PATENTS

| | | | |
|---|---|---|---|
| 3,084,079 | 4/1963 | Harrington | 148—33 X |
| 3,115,424 | 12/1963 | Eannarino | 117—161 ZA |
| 3,281,291 | 10/1966 | Greenberg et al. | 148—188 |
| 3,615,943 | 10/1971 | Genser | 117—201 |

OTHER REFERENCES

Rochow, E. G.: The Organosilicon Polymers, In Chem. & Eng. News, 23(7): pp. 612–616, Apr. 10, 1945.

CAMERON K. WEIFFENBACH, Primary Examiner

U.S. Cl. X.R.

117—161 ZA; 148—188, 190